(12) United States Patent
Tsunashima

(10) Patent No.: US 9,331,078 B2
(45) Date of Patent: May 3, 2016

(54) THIN FILM TRANSISTOR DEVICE

(71) Applicant: Japan Display Inc., Minato-ku (JP)

(72) Inventor: Takanori Tsunashima, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/738,017

(22) Filed: Jun. 12, 2015

(65) Prior Publication Data

US 2015/0364469 A1    Dec. 17, 2015

(30) Foreign Application Priority Data

Jun. 12, 2014    (JP) .................................. 2014-121654

(51) Int. Cl.
*H01L 27/12* (2006.01)
*H01L 27/092* (2006.01)

(52) U.S. Cl.
CPC .......... *H01L 27/092* (2013.01); *H01L 27/1214* (2013.01)

(58) Field of Classification Search
CPC ........................ H01L 27/092; H01L 27/1214
See application file for complete search history.

(56) References Cited

U.S. PATENT DOCUMENTS 5,956,581 A * 9/1999 Yamazaki ........... H01L 21/3003
117/8
6,255,695 B1 * 7/2001 Kubota ............. H01L 29/41733
257/351

FOREIGN PATENT DOCUMENTS

JP    2006-128411 A    5/2006

* cited by examiner

*Primary Examiner* — Stephen W Smoot
*Assistant Examiner* — Vicki B Booker
(74) *Attorney, Agent, or Firm* — Oblon, McClelland, Maier & Neustadt, L.L.P.

(57) ABSTRACT

According to one embodiment, provided is a thin film transistor device with further improved area efficiency. First contact regions of a first semiconductor layer portion are formed with the first channel region therebetween in a predetermined direction and doped with an N-type impurity, one of the first contact regions electrically connected with a shared electrode, while the other electrically connected with a first electrode. Second contact regions of a second semiconductor layer portion are formed with the second channel region therebetween in the predetermined direction and doped with a P-type impurity, one of the second contact regions electrically connected with the shared electrode, while the other electrically connected with a second electrode. The first and second contact regions are partially disposed alternately and adjacently in a direction intersecting with the predetermined direction.

5 Claims, 4 Drawing Sheets

THIN FILM TRANSISTOR DEVICE

INCORPORATION BY REFERENCE

The present invention claims priority under 35 U.S.C. §119 to Japanese Patent Application No. 2014-121654 filed on Jun. 12, 2014. The content of the application is incorporated herein by reference in its entirety.

FIELD

An embodiment of the present invention relates to a thin film transistor device including first and second thin film transistors adjacent to each other in a predetermined direction.

BACKGROUND

In the market for mobile terminals such as cell-phones and tablet PCs, since larger and higher-definition screens have recently been required for chassis of even the same size, so-called frame narrowing designs have been adopted to reduce the distance from the outermost edge to the screen display area (active area). Amid the ongoing frame portion narrowing, drive circuits have accordingly been required to be disposed efficiently in a reduced area of the frame portion.

Such drive circuits employ, for example, a so-called CMOS circuit in which an N-type thin film transistor and a P-type thin film transistor are provided adjacent to each other and connected in a complementary manner to contribute to a reduction in power consumption. In line with this, there has been a need for a layout with better area efficiency in such a case of proximally disposing an N-type thin film transistor and a P-type thin film transistor.

DETAILED DESCRIPTION

An embodiment provides a thin film transistor device including first and second thin film transistors adjacent to each other in a predetermined direction. The thin film transistor device includes a semiconductor layer, a gate electrode, a shared electrode, and first and second electrodes. The gate electrode includes first and second gate electrode portions and a conductive portion. The first and second gate electrode portions are spaced from each other in the predetermined direction and form part of the first and second thin film transistors. The conductive portion electrically connects the first and second gate electrode portions to each other. The shared electrode is positioned between the first and second gate electrode portions and forms part of the first and second thin film transistors. The first and second electrodes are positioned opposite to the shared electrode with respect to the respective first and second gate electrode portions and form part of the first and second thin film transistors. The semiconductor layer includes a first semiconductor layer portion and a second semiconductor layer portion. The first semiconductor layer portion at least has a first channel region and a pair of first contact regions and forms part of the first thin film transistor. The first channel region is opposed to the first gate electrode portion. The pair of first contact regions are formed with the first channel region therebetween in the predetermined direction and doped with an N-type impurity, one of the first contact regions electrically connected with the shared electrode, while the other electrically connected with the first electrode. The second semiconductor layer portion at least has a second channel region and a pair of second contact regions and forms part of the second thin film transistor. The second channel region is opposed to the second gate electrode portion. The pair of second contact regions are formed with the second channel region therebetween in the predetermined direction and doped with a P-type impurity, one of the second contact regions electrically connected with the shared electrode, while the other electrically connected with the second electrode. The ones of the first and second contact regions are then partially disposed alternately and adjacently in a direction intersecting with the predetermined direction.

An arrangement according to an embodiment will hereinafter be described with reference to the accompanying drawings.

Figure 1A:
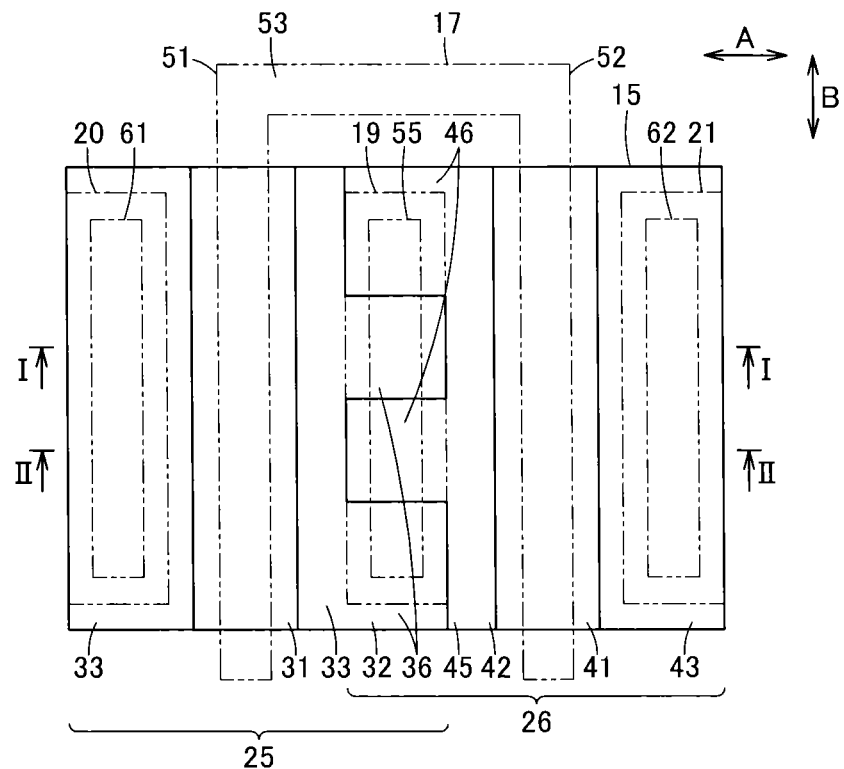
FIG. 1A shows a plan view of a thin film transistor device according to an embodiment.
Figure 1B:
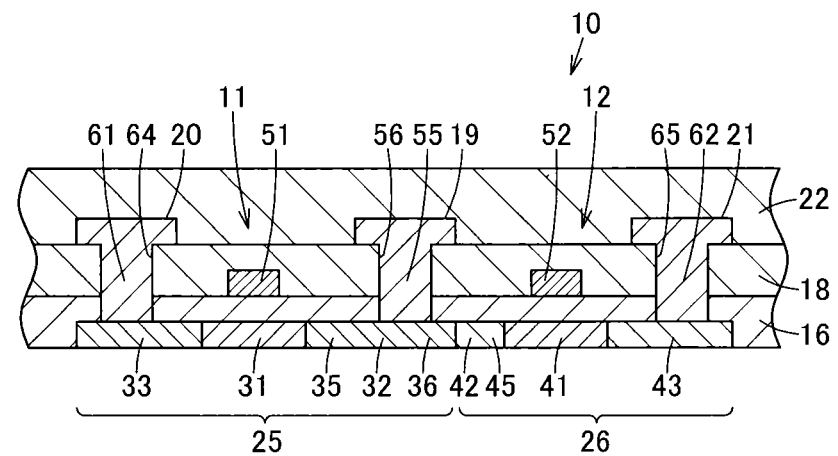
FIG. 1B shows a cross-sectional view taken along the line I-I in FIG. 1A.
Figure 1C:
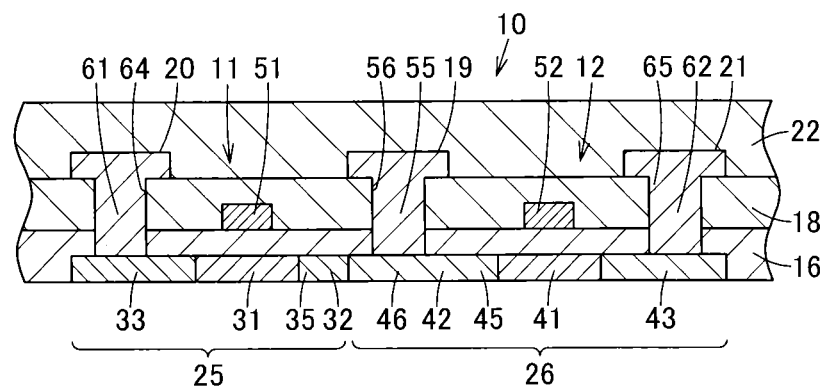
FIG. 1C shows a cross-sectional view taken along the line II-II in FIG. 1A.

In FIGS. 1A, 1B and 1C, the reference numeral 10 denotes a thin film transistor device. The thin film transistor device 10 is used in a drive circuit for a pixel electrode or the like of a flat panel display (FPD) such as a liquid crystal display device or an organic EL display device and disposed in a frame portion outside the display area (active area). The thin film transistor device 10 forms, for example, a CMOS circuit in which a first thin film transistor 11 being an N-channel top-gated thin film transistor and a second thin film transistor 12 being a P-channel top-gated thin film transistor are disposed adjacent to each other in a predetermined direction (horizontal direction in the drawings as indicated by the arrow A) and connected in a complementary manner. In addition, the following description is based on the definition that the side closer to the first thin film transistor 11 is one side of the predetermined direction (first direction (left in the drawings)), while the side closer to the second thin film transistor 12 is the other side of the predetermined direction (second direction opposite to the first direction (right in the drawings)).

The thin film transistor device 10 then includes a semiconductor layer 15 formed on an undercoat layer that is formed in a manner covering an insulating substrate not shown, such as a glass substrate, a gate insulating film 16 such as a silicon dioxide film formed on the undercoat layer (insulating substrate) in a manner covering the semiconductor layer 15, a gate electrode 17 formed on the gate insulating film 16, a first interlayer insulating film 18 such as a silicon nitride film formed on the gate insulating film 16 in a manner covering the gate electrode 17, a shared electrode 19 and first and second electrodes 20 and 21 formed on the first interlayer insulating film 18 and electrically connected with the semiconductor layer 15, and a second interlayer insulating film 22 such as a silicon nitride film formed on the first interlayer insulating film 18 in a manner covering the shared electrode 19 and the first and second electrodes 20 and 21.

The semiconductor layer 15 is a polysilicon (p-Si) film formed in a quadrilateral island shape and integrally includes first and second semiconductor layer portions 25 and 26 adjacent to each other in the predetermined direction (indicated by the arrow A) and forming part of the first and second thin film transistors 11 and 12.

The first semiconductor layer portion 25 has a first channel region 31 and (a pair of) first contact regions 32 and 33 positioned with the first channel region 31 therebetween in the predetermined direction (indicated by the arrow A).

The first contact regions 32 and 33 can also be referred to as (first) highly-doped region doped with an N-type impurity (phosphorus, for example) at a concentration relatively higher than in the first channel region 31 and are positioned, respectively, on the other side and the one side with respect to the first channel region 31. In this embodiment, the first contact region 32 may operate as a first source region, while the other first contact region 33 may operate as a first drain region, for example, and vice versa.

The first contact region 32 is formed in a comb shape including a first joint portion 35 elongated in the direction (vertical direction in FIG. 1A as indicated by the arrow B) intersecting with (orthogonal to) the predetermined direction (indicated by the arrow A) and multiple first quadrilateral (approximately square) protruding portions 36 protruding on the other side (toward the second thin film transistor 12) from the first joint portion 35. The other side of the first contact region 32 then adjacently joins the one side of the second semiconductor layer portion 26 of the second thin film transistor 12.

The first joint portion 35 can also be referred to as (first) channel connecting portion and is formed along the other side of the first channel region 31 to join and be electrically connected with the first channel region 31.

The first protruding portions 36 are disposed in a manner spaced in the intersecting direction (indicated by the arrow B) with respect to the first joint portion 35. The first protruding portions 36 are set to have a width greater than that of the first joint portion 35 in the predetermined direction (indicated by the arrow A).

The other first contact region 33 is also formed in a manner elongated in the intersecting direction (indicated by the arrow B). The other first contact region 33 is formed to have a width smaller than that of the entire first contact region 32 but greater than that of the first joint portion 35 in the predetermined direction (indicated by the arrow A).

On the other hand, the second semiconductor layer portion 26 has a second channel region 41 and (a pair of) second contact regions 42 and 43 positioned with the second channel region 41 therebetween in the predetermined direction (indicated by the arrow A).

The second contact regions 42 and 43 can also be referred to as (second) highly-doped region doped with a P-type impurity (boron, for example) at a concentration relatively higher than in the second channel region 41 and are positioned, respectively, on the one side and the other side with respect to the second channel region 41. In this embodiment, the second contact region 42 may operate as a second source region, while the other second contact region 43 may operate as a second drain region, for example, and vice versa.

The second contact region 42 is formed in a comb shape including a second joint portion 45 elongated in the intersecting direction (indicated by the arrow B) and multiple second quadrilateral (approximately square) protruding portions 46 protruding on the one side (toward the first thin film transistor 11) from the second joint portion 45. The one side of the second contact region 42 then adjacently joins the other side of the first contact region 32 of the first thin film transistor 11.

The second joint portion 45 can also be referred to as (second) channel connecting portion and is formed along the one side of the second channel region 41 to join and be electrically connected with the second channel region 41.

The second protruding portions 46 are disposed in a manner spaced in the intersecting direction (indicated by the arrow B) with respect to the second joint portion 45 and alternating with the first protruding portions 36 in the intersecting direction (indicated by the arrow B). That is, the first contact region 32 and the second contact region 42 are disposed, such that the first protruding portions 36 and the second protruding portions 46 mesh with each other, and adjacently join each other in the predetermined direction (indicated by the arrow A). Further, the second protruding portions 46 are set to have a width greater than that of the second joint portion 45 in the predetermined direction (indicated by the arrow A).

The other second contact region 43 is also formed in a manner elongated in the intersecting direction (indicated by the arrow B). The other second contact region 43 is formed to have a width smaller than that of the entire second contact region 42 but greater than that of the second joint portion 45 and approximately equal to that of the other first contact region 33 in the predetermined direction (indicated by the arrow A).

The gate electrode 17 forms part of the first and second thin film transistors 11 and 12 (shared as part of the first and second thin film transistors 11 and 12), and is formed of a conductive member of, for example, metal such as molybdenum/tungsten (MoW) and electrically insulated from the semiconductor layer 15 (first and second semiconductor layer portions 25 and 26) via the gate insulating film 16. The gate electrode 17 is then formed in an inverted U-shaped (U-shaped) island shape in a plan view, integrally including first and second gate electrode portions 51 and 52 that are spaced from each other in the predetermined direction (indicated by the arrow A) and a conductive portion 53 that electrically connects the first and second gate electrode portions 51 and 52 to each other.

The first and second gate electrode portions 51 and 52 are positioned, in an opposed manner via the gate insulating film 16, over the respective first and second channel regions 31 and 41. The first and second gate electrode portions 51 and 52 are elongated in the intersecting direction (indicated by the arrow B) and set to have a width smaller than that of the first and second channel regions 31 and 41 in the predetermined direction (indicated by the arrow A), and the both end portions in the elongated direction extend outside of the semiconductor layer 15 (first and second semiconductor layer portions 25 and 26).

The conductive portion 53 couples the first and second gate electrode portions 51 and 52 between one end portions in the elongated direction, that is, at a position outside of the semiconductor layer 15 (first and second semiconductor layer portions 25 and 26) to electrically connect the first and second gate electrode portions 51 and 52.

The shared electrode 19 is formed of a conductive member of, for example, metal and forms part of as well as electrically connects the first and second thin film transistors 11 and 12. That is, the first and second thin film transistors 11 and 12 are electrically connected to each other at the positions of the gate electrode 17 and the shared electrode 19. Accordingly, in this embodiment, since the shared electrode 19 operates as first and second source electrodes of the first and second thin film transistors 11 and 12, the first and second thin film transistors 11 and 12 are electrically connected to each other at the first and second gate electrodes and the first and second source electrodes. The shared electrode 19 may, however, operate as first and second drain electrodes of the first and second thin film transistors 11 and 12 and, in this case, the first and second thin film transistors 11 and 12 are electrically connected to each other at the first and second gate electrodes and the first and second drain electrodes. The shared electrode 19 is also positioned between the first and second gate electrode portions 51 and 52 and formed, in an elongated and opposed manner, over the first and second contact regions 32 and 42 (first and second protruding portions 36 and 46) via the gate insulating film 16 and the first interlayer insulating film 18 in the intersecting direction (indicated by the arrow B). That is, the shared electrode 19 is formed in the direction in which the first and second protruding portions 36 and 46 are adjacent to each other, so as to be opposed alternately to the first and second protruding portions 36 and 46. The shared electrode 19 then integrally includes a shared contact portion 55 protruding downward, and the shared contact portion 55 is formed in an elongated manner in the intersecting direction (indicated by the arrow B) and electrically connected with the first and second contact regions 32 and 42 (first and second protruding portions 36 and 46) via a shared contact hole 56 provided through the gate insulating film 16 and the first interlayer insulating film 18. The shared electrode 19 thus has an approximately T shape in a cross-section. The shared electrode 19 is also set to have a width approximately equal to that of the first and second protruding portions 36 and 46 in the predetermined direction (indicated by the arrow A) so as to be regularly opposed to the first and second protruding portions 36 and 46 via the gate insulating film 16 and the first interlayer insulating film 18 without protruding in the predetermined direction (indicated by the arrow A).

The first and second electrodes 20 and 21 are each formed of a conductive member of, for example, metal and positioned opposite to the shared electrode 19 with respect to the respective first and second gate electrode portions 51 and 52. That is, the first and second gate electrode portions 51 and 52 (first and second channel regions 31 and 41) are positioned between the respective first and second electrodes 20 and 21 and the shared electrode 19. Further, the first and second electrodes 20 and 21 are formed, in an elongated and opposed manner, over the other first and second contact regions 33 and 43 via the gate insulating film 16 and the first interlayer insulating film 18 in the intersecting direction (indicated by the arrow B). That is, the first and second electrodes 20 and 21 are formed approximately parallel with the shared electrode 19. The first and second electrodes 20 and 21 then integrally include first and second contact portions 61 and 62 protruding downward, and the first and second contact portions 61 and 62 are each formed in an elongated manner in the intersecting direction (indicated by the arrow B) and electrically connected with the other first and second contact regions 33 and 43, respectively, via first and second contact holes 64 and 65 provided through the gate insulating film 16 and the first interlayer insulating film 18. Thus, the first and second electrodes 20 and 21 each have an approximately T shape in a cross-section. The first and second electrodes 20 and 21 are also set to have a width approximately equal to that of the shared electrode 19 in the predetermined direction (indicated by the arrow A). In addition, the first and second electrodes 20 and 21, which operate as, for example, first and second drain electrodes of the first and second thin film transistors 11 and 12 in this embodiment, may operate as first and second source electrodes. Accordingly, one of the shared electrode 19 and the first and second electrodes 20 and 21 is set as a source electrode, while the other is set as a drain electrode.

Next will be described a manufacturing method according to the embodiment.

First, an undercoat layer and the like are formed on an insulating substrate and a polysilicon film is formed on the undercoat layer, and then the polysilicon film is formed into an island shape through a predetermined patterning process such as PEP.

Next, a gate insulating film 16 is formed to cover the polysilicon film, and then a conductive member of, for example, metal is formed on the gate insulating film 16 to form a gate electrode 17 through a predetermined patterning process such as PEP.

Further, through a process of forming a predetermined mask and doping the entire substrate with phosphorus (P) and boron (B), the polysilicon film is processed into a semiconductor layer 15 formed with first and second semiconductor layer portions 25 and 26 including first and second channel regions 31 and 41 and first and second contact regions 32, 33, 42, and 43. In this state, the first and second contact regions 32 and 42 are formed with first and second protruding portions 36 and 46 alternately adjacent to each other in the intersecting direction (indicated by the arrow B).

After a predetermined subsequent heat treatment and the like, a first interlayer insulating film 18 is further formed, through a predetermined film forming process using, for example, a plasma CVD method, to cover the gate electrode 17.

Further, contact holes 56, 64, and 65 are formed through the first interlayer insulating film 18 and, using, for example, a sputtering method, a shared electrode 19 and first and second electrodes 20 and 21 are formed to cover the contact holes 56, 64, and 65.

Through a predetermined film forming process using, for example, a plasma CVD method, a second interlayer insulating film 22 is then formed to cover the shared electrode 19 and the first and second electrodes 20 and 21.

Thereafter, contact holes and the like are formed as needed, and the shared electrode 19 and the first and second electrodes 20 and 21 are electrically connected to other circuits, interconnections, electrodes, and the like.

In accordance with the above-described embodiment, since the first and second protruding portions 36 and 46, which are part of the first contact region 32 of the first semiconductor layer portion 25 of the semiconductor layer 15 electrically connected with the shared electrode 19 and the second contact region 42 of the second semiconductor layer portion 26 of the semiconductor layer 15 electrically connected with the shared electrode 19, are disposed alternately in the intersecting direction (indicated by the arrow B) intersecting with the predetermined direction (indicated by the arrow A), it is possible to ensure an area for connection with the shared electrode 19 without unnecessarily expanding the first and second contact regions 32 and 42 in the predetermined direction (indicated by the arrow A). It is therefore possible to further improve the area efficiency of the thin film transistor device 10 without losing the reliability of connection with the shared electrode 19.

Figure 2A:
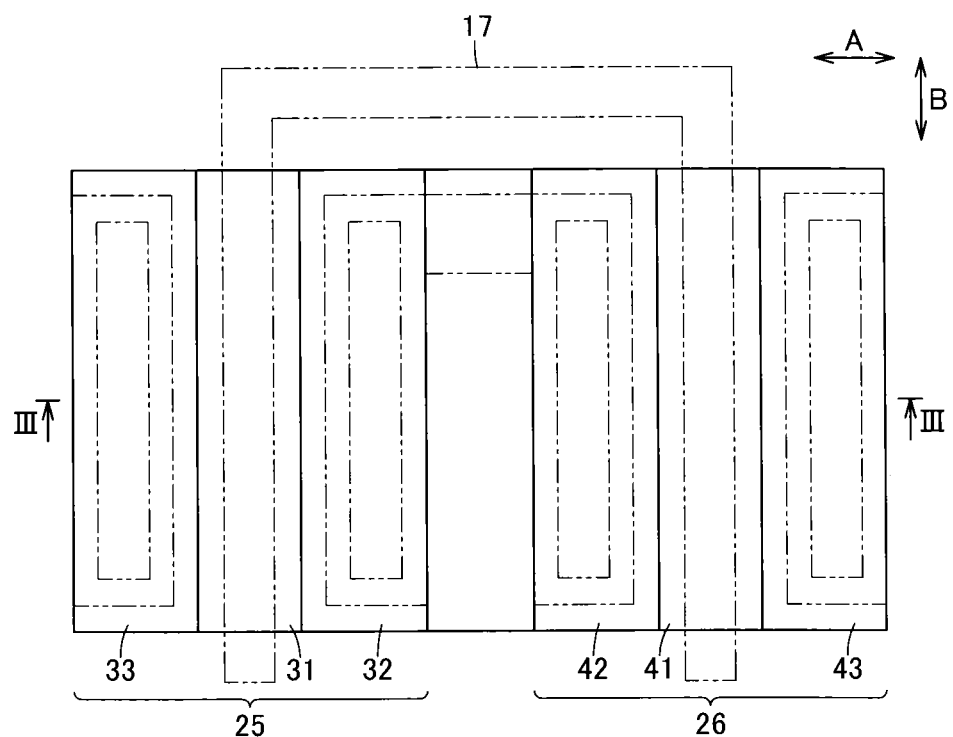
FIG. 2A shows a plan view of a thin film transistor device according to a first conventional example.
Figure 2B:
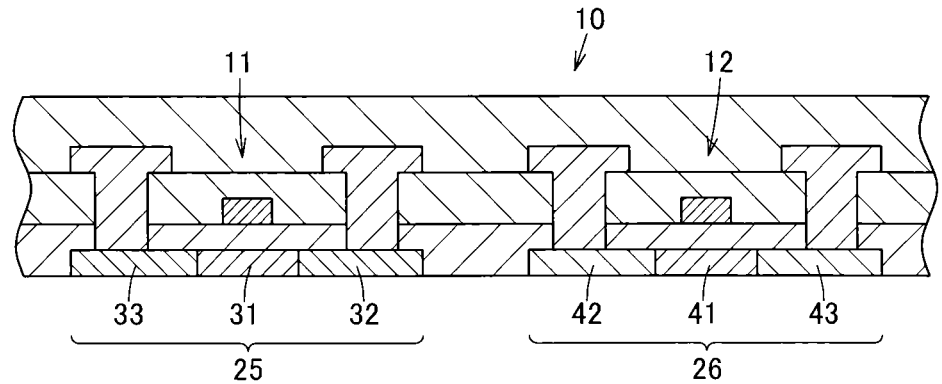
FIG. 2B shows a cross-sectional view taken along the line III-III in FIG. 2A.
Figure 3A:
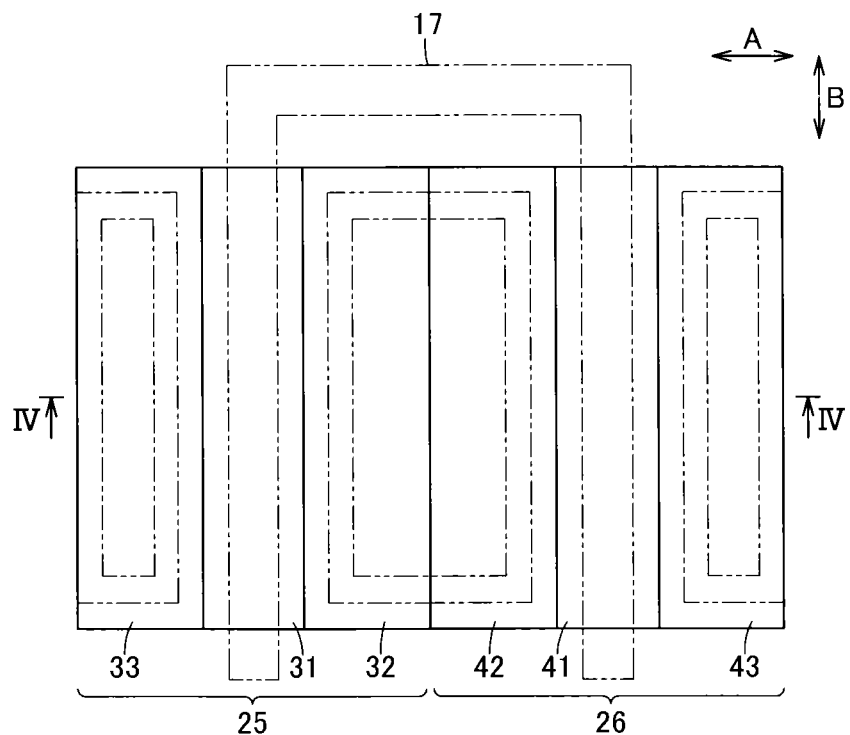
FIG. 3A shows a plan view of a thin film transistor device according to a second conventional example.
Figure 3B:
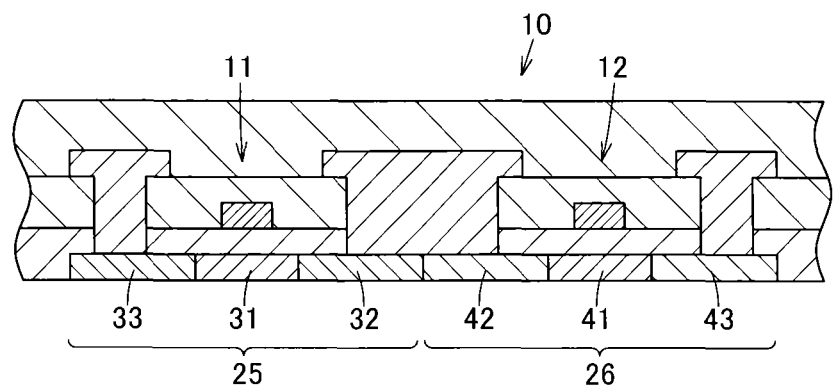
FIG. 3B shows a cross-sectional view taken along the line IV-IV in FIG. 3A.

That is, the first and second contact regions 32 and 42, which are disposed such that the first and second protruding portions 36 and 46 formed in a comb shape protrude at intervals and mesh with each other, can be arranged such that the widths overlap each other in the predetermined direction (indicated by the arrow A). This allows for an arrangement in a smaller space than the structure in which the first and second contact regions 32 and 42 are spaced from each other as shown in FIGS. 2A and 2B or the structure in which the first and second contact regions 32 and 42 are only adjacent to each other as in the conventional example described in Patent Document 1 shown in FIGS. 3A and 3B, while reliably connecting the shared electrode 19 and the first and second contact regions 32 and 42.

In particular, since display devices have recently been undergoing higher-definition and the width of the thin film transistor device 10 in the predetermined direction (indicated by the arrow A) is almost the same as the pixel pitch, even a small difference in the circuit width of about 1 µm or less per one thin film transistor device 10, compared to the conventional example, would lead to a large dimensional difference of about several hundreds of micrometers in total. It is therefore possible to accommodate a narrower frame portion.

In addition, since the first and second contact regions 32 and 42 join the first and second channel regions 31 and 41 through the strip-formed first and second joint portions 35 and 45, it is possible, in the first and second semiconductor layer portions 25 and 26 having their respective different polarities, to ensure a certain joint area between the first and second channel regions 31 and 41 and the first and second contact regions 32 and 42 compared to the case where the leading ends of the first and second protruding portions 36 and 46, for example, join the second and first channel regions 41 and directly. It is therefore possible to suppress the degradation in the device performance of the first and second thin film transistors 11 and 12 more reliably.

As a result, it is possible to arrange a CMOS circuit having a thin film transistor device 10 with approximately the same driving performance in a narrower area compared to the conventional layout.

In addition, in the above-described embodiment, an LDD region with an impurity concentration relatively lower than that of the first contact regions 32 and 33 (second contact regions 42 and 43) may be provided between the first channel region 31 (second channel region 41) and the first contact regions 32 and 33 (second contact regions 42 and 43) in the first semiconductor layer portion 25 (second semiconductor layer portion 26).

While a certain embodiment of the present invention has heretofore been described, the embodiment has been presented by way of example only and is not intended to limit the scope of the invention. Indeed, the novel embodiment described herein may be embodied in a variety of other forms ; furthermore, various omissions, substitutions, and variations may be made without departing from the spirit of the invention. The appended claims and their equivalents are intended to cover the embodiment and its modifications as would fall within the scope and spirit of the invention.

What is claimed is:

1. A thin film transistor device including first and second thin film transistors adjacent to each other in a predetermined direction, the thin film transistor device comprising:
   a semiconductor layer;
   a gate electrode including first and second gate electrode portions that are spaced from each other in the predetermined direction and form part of the first and second thin film transistors and a conductive portion that electrically connects the first and second gate electrode portions to each other;
   a shared electrode positioned between the first and second gate electrode portions and forming part of the first and second thin film transistors; and
   first and second electrodes positioned opposite to the shared electrode with respect to the respective first and second gate electrode portions and forming part of the first and second thin film transistors, wherein
   the semiconductor layer includes:
   a first semiconductor layer portion at least having a first channel region opposed to the first gate electrode portion and a pair of first contact regions formed with the first channel region therebetween in the predetermined direction and doped with an N-type impurity, one of the first contact regions electrically connected with the shared electrode, while the other electrically connected with the first electrode, the first semiconductor layer portion forming part of the first thin film transistor; and
   a second semiconductor layer portion at least having a second channel region opposed to the second gate electrode portion and a pair of second contact regions formed with the second channel region therebetween in the predetermined direction and doped with a P-type impurity, one of the second contact regions electrically connected with the shared electrode, while the other electrically connected with the second electrode, the second semiconductor layer portion forming part of the second thin film transistor, wherein
   the ones of the first and second contact regions are partially disposed alternately and adjacently in a direction intersecting with the predetermined direction.

2. The thin film transistor device according to claim 1, wherein
   the ones of the first and second contact regions include:
   first and second strip-shaped joint portions coupled with the respective first and second channel regions; and
   first and second protruding portions protruding from the respective first and second joint portions, wherein
   the first and second protruding portions are disposed alternately in the intersecting direction.

3. The thin film transistor device according to claim 1, wherein the N-type impurity is phosphorus.

4. The thin film transistor device according to claim 1, wherein the P-type impurity is boron.

5. The thin film transistor device according to claim 1, wherein the first and second thin film transistors form a CMOS circuit.

* * * * *